(12) United States Patent
Ragatz et al.

(10) Patent No.: US 12,184,037 B2
(45) Date of Patent: Dec. 31, 2024

(54) MULTI-MODAL IMAGING SYSTEMS AND METHODS

(71) Applicant: LI-COR BIOTECH, LLC, Lincoln, NE (US)

(72) Inventors: Andrew Ragatz, Lincoln, NE (US); Mark Fiedler, Lincoln, NE (US)

(73) Assignee: LI-COR BIOTECH, LLC, Lincoln, NE (US)

( * ) Notice: Subject to any disclaimer, the term of this patent is extended or adjusted under 35 U.S.C. 154(b) by 406 days.

(21) Appl. No.: 17/405,592

(22) Filed: Aug. 18, 2021

(65) Prior Publication Data

US 2022/0054011 A1 Feb. 24, 2022

Related U.S. Application Data

(60) Provisional application No. 63/067,661, filed on Aug. 19, 2020.

(51) Int. Cl.
*H01S 5/40* (2006.01)
*G01N 21/25* (2006.01)
(Continued)

(52) U.S. Cl.
CPC ....... *H01S 5/4012* (2013.01); *G01N 21/6456* (2013.01); *G01N 21/76* (2013.01);
(Continued)

(58) Field of Classification Search
CPC ... H01S 5/4012; G02B 7/003; G02B 21/0076; G02B 21/26; G02B 21/362;
(Continued)

(56) References Cited

U.S. PATENT DOCUMENTS 5,228,357 A * 7/1993 Dosaka .................... G12B 5/00
108/143
6,043,506 A * 3/2000 Heffelfinger ........... G03B 42/00
250/584
(Continued)

FOREIGN PATENT DOCUMENTS

WO WO-2006005810 A1 * 1/2006 ............ C12M 41/36

OTHER PUBLICATIONS

Written Opinion of the International Search Authority, dated Nov. 24, 2021, in Application No. PCT/US2021/046660.
(Continued)

*Primary Examiner* — Mohamed K Amara
*Assistant Examiner* — Noah J. Haney
(74) *Attorney, Agent, or Firm* — Gerald T. Gray; Leydig, Voit & Mayer, LTD.

(57) ABSTRACT

Multi-modality imaging systems and methods for enabling controllable and/or automated switching between different imaging systems or modes. An imaging system includes a base plate having a first exposed region and a second region, a sample stage configured to hold a sample platform, and a first translation mechanism configured to translate the sample stage on the base plate along a first axis between a first position and a second position. In the first position the sample stage is positioned proximal to the first exposed region, and in the second position, the sample stage is positioned proximal to the second region. An illumination device is configured to illuminate a portion of the first exposed region, and a second translation mechanism is configured to translate the illumination device along a second axis substantially perpendicular to the first axis.

19 Claims, 12 Drawing Sheets

(51) Int. Cl.
  *G01N 21/64* (2006.01)
  *G01N 21/76* (2006.01)
  *G02B 7/00* (2021.01)
  *G02B 21/00* (2006.01)
  *G02B 21/26* (2006.01)
  *G02B 21/36* (2006.01)

(52) U.S. Cl.
  CPC ......... *G02B 7/003* (2013.01); *G02B 21/0076* (2013.01); *G02B 21/26* (2013.01); *G02B 21/362* (2013.01); *G01N 21/253* (2013.01); *G01N 2021/6419* (2013.01); *G01N 21/6452* (2013.01); *G01N 2201/103* (2013.01); *G01N 2201/1047* (2013.01)

(58) Field of Classification Search
  CPC ...... G01N 2201/103; G01N 2201/1047; A61B 5/316; A61B 6/4417; G06T 2211/464; G06V 40/70
  USPC .......................................... 356/318
  See application file for complete search history.

(56) References Cited

U.S. PATENT DOCUMENTS

| | | | | |
|---|---|---|---|---|
| 8,254,022 | B2 * | 8/2012 | McMurtry | G02B 21/26 359/393 |
| 11,536,655 | B1 * | 12/2022 | Lee | G02B 21/26 |
| 11,740,447 | B2 * | 8/2023 | Shumate | G02B 21/361 359/368 |
| 2003/0173509 | A1 * | 9/2003 | Ito | G02B 21/362 250/235 |
| 2004/0095615 | A1 | 5/2004 | Tsai | |
| 2005/0068615 | A1 * | 3/2005 | Delaage | G02B 21/26 359/393 |
| 2005/0178976 | A1 * | 8/2005 | Steele | G02B 21/26 250/440.11 |
| 2007/0153369 | A1 * | 7/2007 | Schutze | B01L 9/523 359/368 |
| 2012/0106702 | A1 | 5/2012 | Feke | |
| 2014/0191109 | A1 | 7/2014 | Chamberlin et al. | |
| 2015/0276605 | A1 * | 10/2015 | Kawamuki | G01N 21/6454 250/216 |
| 2015/0278625 | A1 * | 10/2015 | Finkbeiner | G02B 21/0088 348/79 |
| 2015/0370058 | A1 * | 12/2015 | Bouzid | G02B 17/0615 359/385 |
| 2016/0054235 | A1 * | 2/2016 | Kim | G01N 21/94 356/237.3 |
| 2017/0309063 | A1 | 10/2017 | Wang | |
| 2018/0024253 | A1 * | 1/2018 | Jacobs | G01T 1/1603 378/62 |
| 2018/0180550 | A1 | 6/2018 | Franjic et al. | |
| 2019/0017937 | A1 * | 1/2019 | Nagai | G02B 21/36 |
| 2019/0154595 | A1 * | 5/2019 | Rempel | A61B 6/4417 |
| 2020/0096455 | A1 | 3/2020 | Lin et al. | |
| 2023/0152210 | A1 * | 5/2023 | Chu | G02B 21/0088 382/133 |

OTHER PUBLICATIONS

International Search Report of the International Search Authority, dated Nov. 24, 2021, in Application No. PCT/US2021/046660.

* cited by examiner

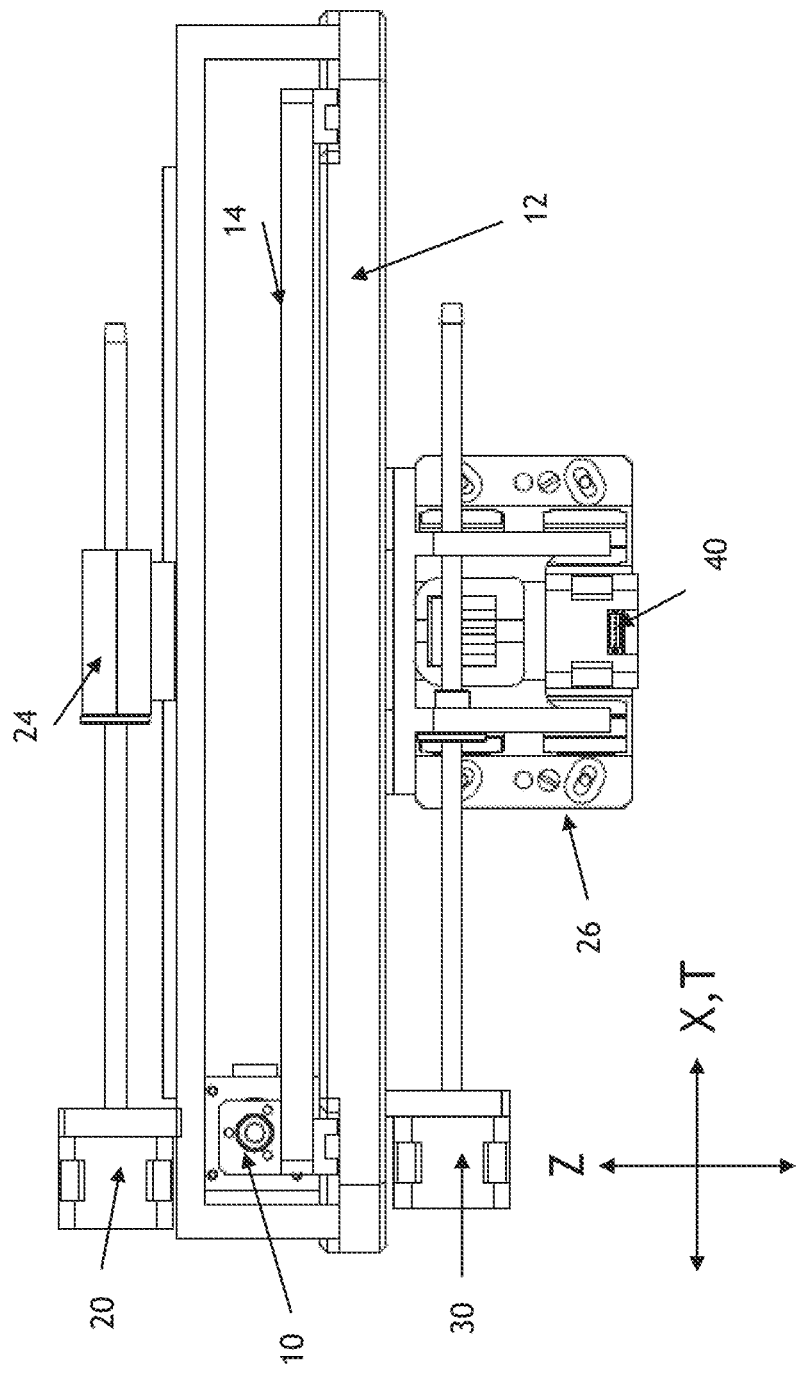

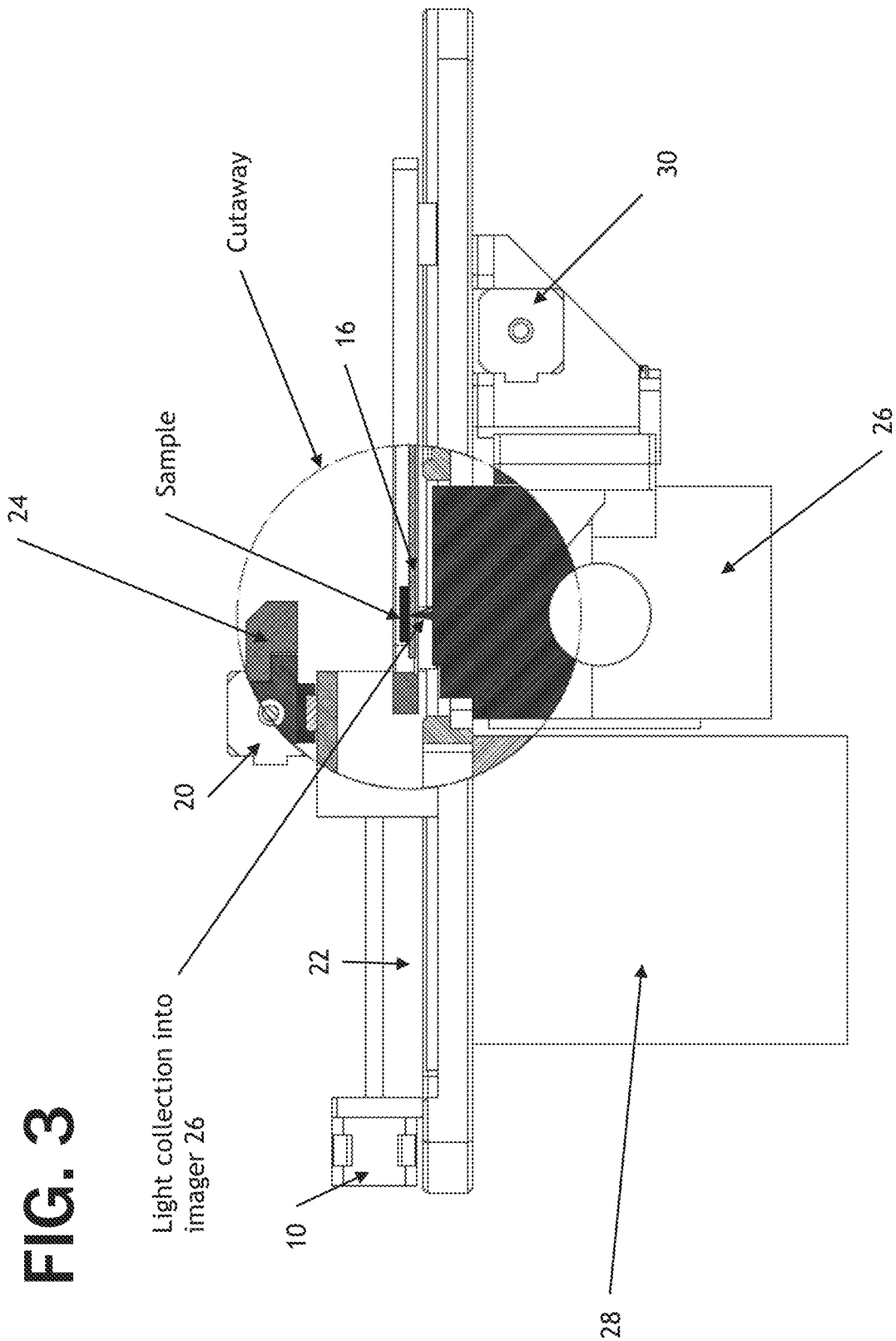

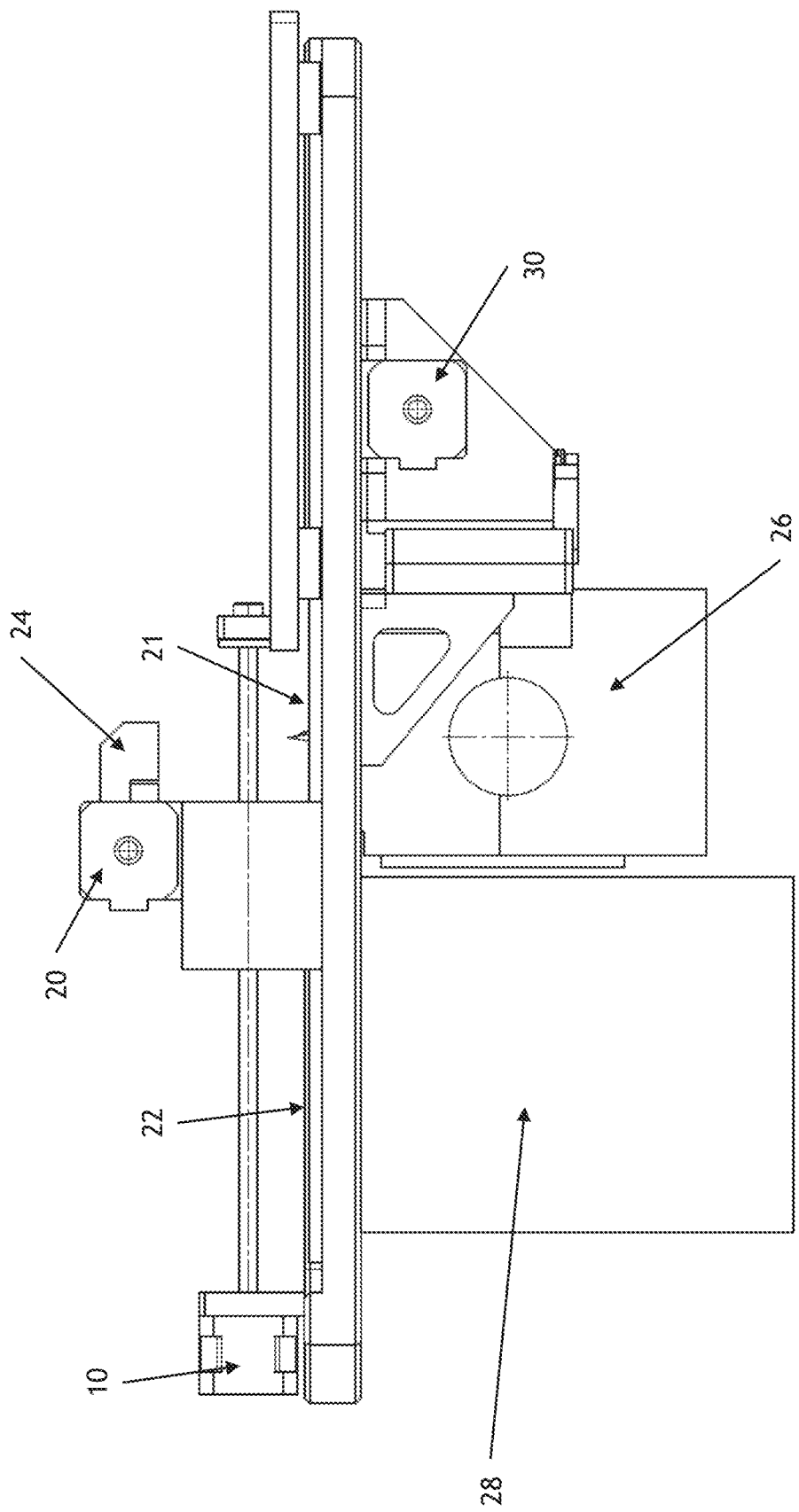

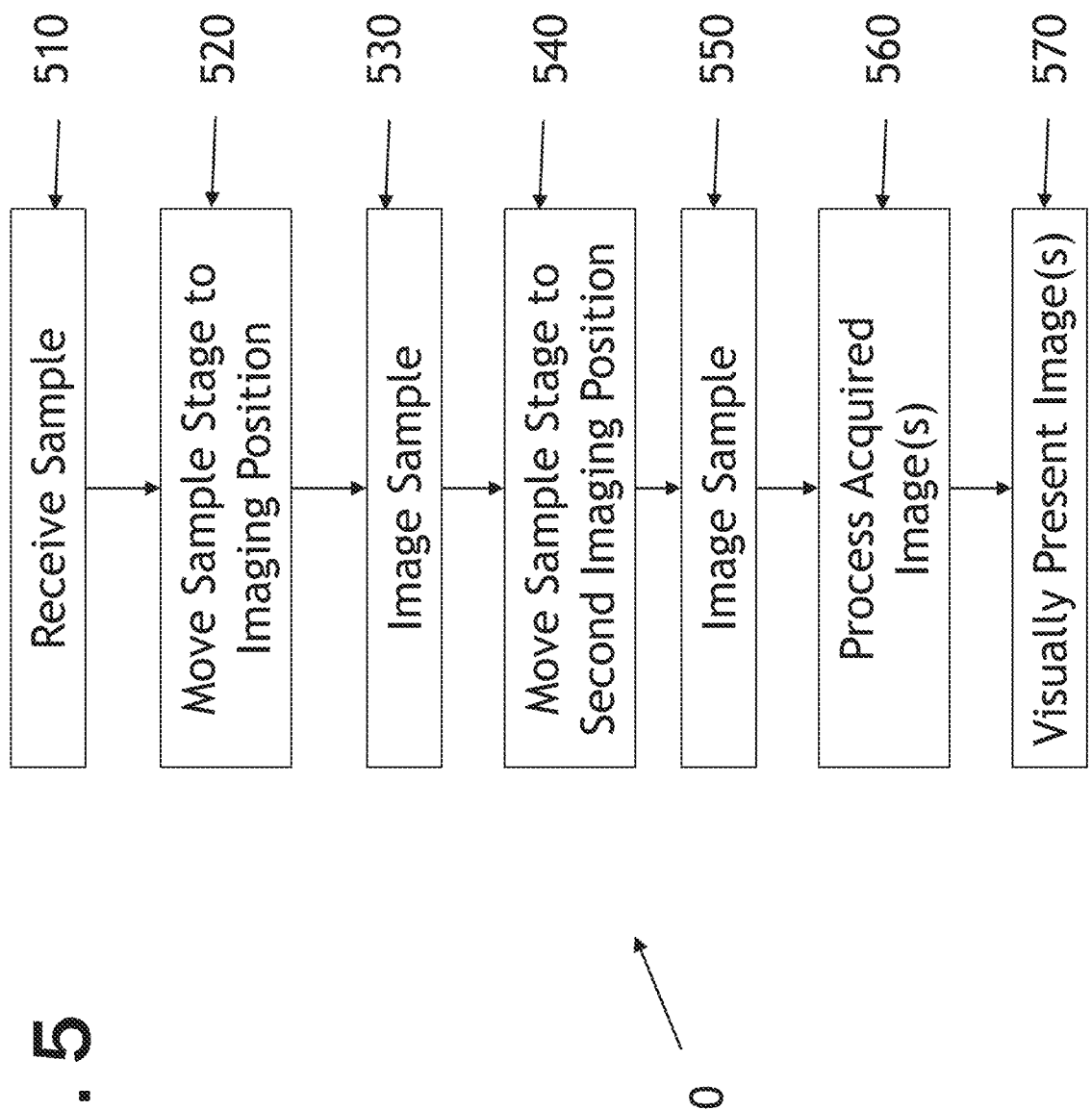

MULTI-MODAL IMAGING SYSTEMS AND METHODS

CROSS-REFERENCE TO RELATED APPLICATION

This application claims the benefit of priority to U.S. Provisional Patent Application No. 63/067,661, filed Aug. 19, 2020, which is hereby incorporated by reference in its entirety.

SUMMARY

The present disclosure provides multi-feature imaging systems and methods.

Various embodiments advantageously provide systems and methods for imaging a sample with one or multiple imaging modalities using the same imaging system layout. Various embodiments advantageously combine optical imaging modalities such as a line-scanning imaging system with an area imaging system on the same system platform layout. In certain embodiments, the systems and methods advantageously enable controllable and/or automated switching between imaging modalities and capturing images of a sample using the various imaging modalities.

The various embodiments advantageously enable optimized quantitative measurements of a sample plane, e.g., one or more targets of interest at or on the sample plane, which may be applicable for various scientific applications, such as but not limited to, e.g., electromagnetic spectrum imaging, fluorescence imaging, chemiluminescence imaging and the like.

According to an embodiment, an imaging system is provided that includes a base plate having a first exposed region and a second region, a sample stage, configured to hold a sample platform, and a first translation mechanism, coupled with the base plate and the sample stage and configured to translate the sample stage on the base plate along a first axis between a first position and a second position, wherein when in the first position a first portion of the sample stage is positioned proximal to the first exposed region in the base plate, and when in the second position, the first portion of the sample stage is positioned proximal to the second region of the base plate. The system may also include an illumination device located proximal to the base plate, and configured to illuminate a portion of the first exposed region in the base plate, and a second translation mechanism, coupled with the base plate and the illumination device and configured to translate the illumination device along a second axis, the second axis being substantially perpendicular to the first axis. The system may also include a first imager located proximal to the base plate on a side opposite the sample stage and configured to image the portion of the first exposed region in the base plate, and a third translation mechanism, coupled with the base plate and the first imager and configured to translate the first imager along a third axis, the third axis being parallel to the second axis.

In certain aspects, the system further comprising a fourth translation mechanism coupled with the third translation mechanism and configured to translate the first imager along a fourth axis, the fourth axis being substantially perpendicular to both the third axis and the first axis. In certain aspects, the second region is a second exposed region in the base plate, and the system further comprising a second imager located proximal to the base plate and configured to image a region proximal to the second exposed region in the base plate. In certain aspects, the second imager is located proximal the base plate on the side opposite the sample stage. In certain aspects, the second imager is located proximal the base plate on the same side as the sample stage.

In certain aspects, the second translation mechanism and the third translation mechanism are configured to move together so as to translate the illumination device along the second axis simultaneously or in step with moving the first imager along the third axis. In certain aspects, the second region of the base plate is a loading region that provides access to load the sample platform on the sample stage. In certain aspects, the second region is a second exposed region in the base plate, wherein the first translation mechanism is further configured to translate the sample stage on the base plate along the first axis to a third position proximal to a loading region of the base plate, wherein when in the third position the first portion of the sample stage is positioned proximal the loading region and provides access to load the sample platform on the sample stage.

In certain aspects, the system further includes a control system comprising one or more processors, the control system configured to control operation of at least the first translation mechanism, the second translation mechanism and the third translation mechanism. In certain aspects, the control system is further configured to control operation of the first imager and the illumination device. In certain aspects, the control system is further configured to control operation of the fourth translation mechanism.

In certain aspects, the base plate includes grid lines thereon to enable accurate positioning of the sample on the sample platform when the sample platform is coupled with the sample stage. In certain aspects, the illumination device is located proximal to the base plate on an opposite side of the base plate as the sample stage, and configured to illuminate a portion of the first exposed region in the base plate. In certain aspects, the illumination device includes one or multiple illumination sources. In certain aspects, the one or multiple illumination sources are located proximal to the base plate on an opposite side and/or same side of the base plate as the sample stage, and configured to illuminate a portion of the first exposed region in the base plate. In certain aspects, each of the one or multiple illumination sources emit light at different wavelengths.

In certain aspects, the first imager comprises a fluorescence imaging system and the second imager includes a chemiluminescence imaging system. In certain aspects, the fluorescence imaging system includes a bi-telecentric imaging system. In certain aspects, the first imager includes an imaging device and one or multiple light sources positioned such that either 1) light from the one or multiple light sources incident on the sample stage proximal the first exposed region reflects toward the imaging device, or 2) light incident on the sample stage is coaxial with an imaging axis of the imaging device.

According to another embodiment, a method of imaging a sample using any of the systems described herein is provided. The method includes receiving a sample on the sample platform on the sample stage, wherein the sample is positioned on the sample platform proximal to the first portion of the sample stage, and imaging the sample using the first imager when the sample stage is in the first position, wherein the sample is proximal to the first exposed region in the base plate when the sample stage is in the first position.

In certain aspects, the imaging the sample using the first imager includes acquiring a first image of the sample, translating, using the third translation mechanism, the first imager along the third axis, and acquiring a second image of the sample, wherein the second image of the sample and the first image cover different portions of the sample. In certain aspects, the acquiring an image includes line-scanning a portion of the sample. In certain aspects, the acquiring an image includes illuminating the sample using the illumination device, the method further including translating the illumination device along the second axis, so that the illumination device is positioned to illuminate at least a portion of the sample being imaged by the first imaging device.

In certain aspects, the imaging the sample using the first imager includes acquiring a first image of the sample, translating, using the fourth translation mechanism, the first imager along the fourth axis, and acquiring a second image of the sample, wherein the second image is taken such that a focal plane of the first imager is located at a different position in the sample when compared with the first image.

In certain aspects, the receiving the sample platform on the sample stage includes translating the sample stage, using the first translation mechanism, to the loading position on the base plate, receiving a sample on the sample platform, receiving the sample platform on the sample stage, and thereafter translating the sample stage, using the first translation mechanism, to the first position.

In certain aspects, the method further includes translating, using the first translation mechanism, the sample stage along the first axis to the second position, and imaging the sample using the second imager when the sample stage is in the second position, wherein the sample is proximal to the second exposed region in the base plate when the sample stage is in the second position.

According to another embodiment, a method of imaging a sample using any of the systems described herein is provided. The method includes receiving the sample platform on the sample stage, wherein the sample is positioned on the sample platform proximal to the first portion of the sample stage, and imaging the sample using the second imager when the sample stage is in the second position, wherein the sample is proximal to the second region in the base plate when the sample stage is in the first position, wherein the second region is an exposed region in the base plate.

In certain aspects, the receiving the sample platform on the sample stage includes translating the sample stage, using the first translation mechanism, to the loading position on the base plate, receiving a sample on the sample platform, receiving the sample platform on the sample stage, and thereafter translating the sample stage, using the first translation mechanism, to the second position.

In certain aspects, the method further includes translating, using the first translation mechanism, the sample stage along the first axis to the first position, and imaging the sample using the first imager when the sample stage is in the first position, wherein the sample is proximal to the first exposed region in the base plate when the sample stage is in the first position.

According to another embodiment, a method of imaging a sample using any of the systems described herein is provided. The method includes receiving the sample platform on the sample stage, wherein the sample is positioned on the sample platform proximal to the first portion of the sample stage, acquiring one or more first images of the sample using the first imager when the sample stage is in the first position, wherein the sample is proximal to the first exposed region in the base plate when the sample stage is in the first position, and acquiring one or more second images of the sample using the second imager when the sample stage is in the second position, wherein the sample is proximal to the second region of the base plate when the sample stage is in the second position.

In certain aspects, the method further includes combining the one or more first images with the one or more second images to form one or more combined images of the sample. In certain aspects, the one or more first images are line-scan images, each first image taken at a different position relative to a prior first image, and wherein the method further includes stitching the one or more first images together to form a combined image of the sample.

In certain aspects, the systems described herein may further include a control system module including at least one processor, wherein the control system module is communicably coupled with and adapted to control operation of the system components, such as activating illumination sources (e.g., LED(s), lasers, etc.), activating or reading detectors, controlling various adjustable optical components and adjustable mechanical components, including mechanical actuators for adjusting or translating physical positions of various components such as illumination devices and imaging devices, and a stage or platform that holds a sample, which may include one or more targets of interest at or on the sample plane, etc.

In certain aspects, a sample may include one or more targets of interest, and the multi-modality imaging system is configured to capture or acquire images of the one or more targets of interest using one or multiple imaging systems such as a line-scanning system and an area imaging or wide-field imaging system. Specific examples include an electromagnetic spectrum imaging system, a fluorescence imaging system, a chemiluminescence imaging system, or like imaging systems. In certain aspects, for fluorescence imaging as an example, the one or more targets of interest (e.g., within or on a sample, which may be located on a sample platform) may comprise a fluorescent material, and the illumination device emits light at one or more wavelengths in the absorption band(s) of the fluorescent material(s) comprised within the one or more targets of interest.

In a further embodiment, a non-transitory computer readable medium is provided that stores instructions, which when executed by at least one processor, causes the at least one processor to control operation of the system components and to implement any method as described herein. Examples of computer readable media include RAM, ROM, CDs, DVDs, ASICs, FPGAs or other circuit elements including memory elements.

Reference to the remaining portions of the specification, including the drawings and claims, will realize other features and advantages of the present invention. Further features and advantages of the present invention, as well as the structure and operation of various embodiments of the present invention, are described in detail below with respect to the accompanying drawings. In the drawings, like reference numbers indicate identical or functionally similar elements.

BRIEF DESCRIPTION OF THE SEVERAL VIEWS OF THE DRAWING(S)

FIG. 1D shows a frontal view of the multi-modality imaging system of FIG. 1A, according to an embodiment.

FIG. 3 shows a side-view of the multi-modality imaging system including two imaging systems, and includes a cutaway showing a sample laying on the sample platform between the first imaging system and the illumination device, according to an embodiment.

FIG. 4 shows the same side-view of the multi-modality imaging system as shown in FIG. 3, but without the cutaway.

FIG. 5 shows a method of imaging a sample using one or multiple imaging modalities, according to an embodiment.

DETAILED DESCRIPTION

Various system and method embodiments are provided for enabling automatic switching between multiple imaging modalities for imaging a sample and/or one or more targets of interest on or within the sample. In certain embodiments, the systems and methods advantageously enable imaging of a sample and/or one or more targets of interest on or within the sample using one or multiple different imaging modalities associated with the same system platform. Such information may be useful for research scientists who would like to know more detail, such as where in a sample a certain target of interest, biomarker, probe, tracer, contrast agent or dye molecule and the like is located in addition to spatial and temporal information, the physiological information, phenotypical information, efficacy and potency information that may be derived from imaging a sample, for example.

Figure 1A:
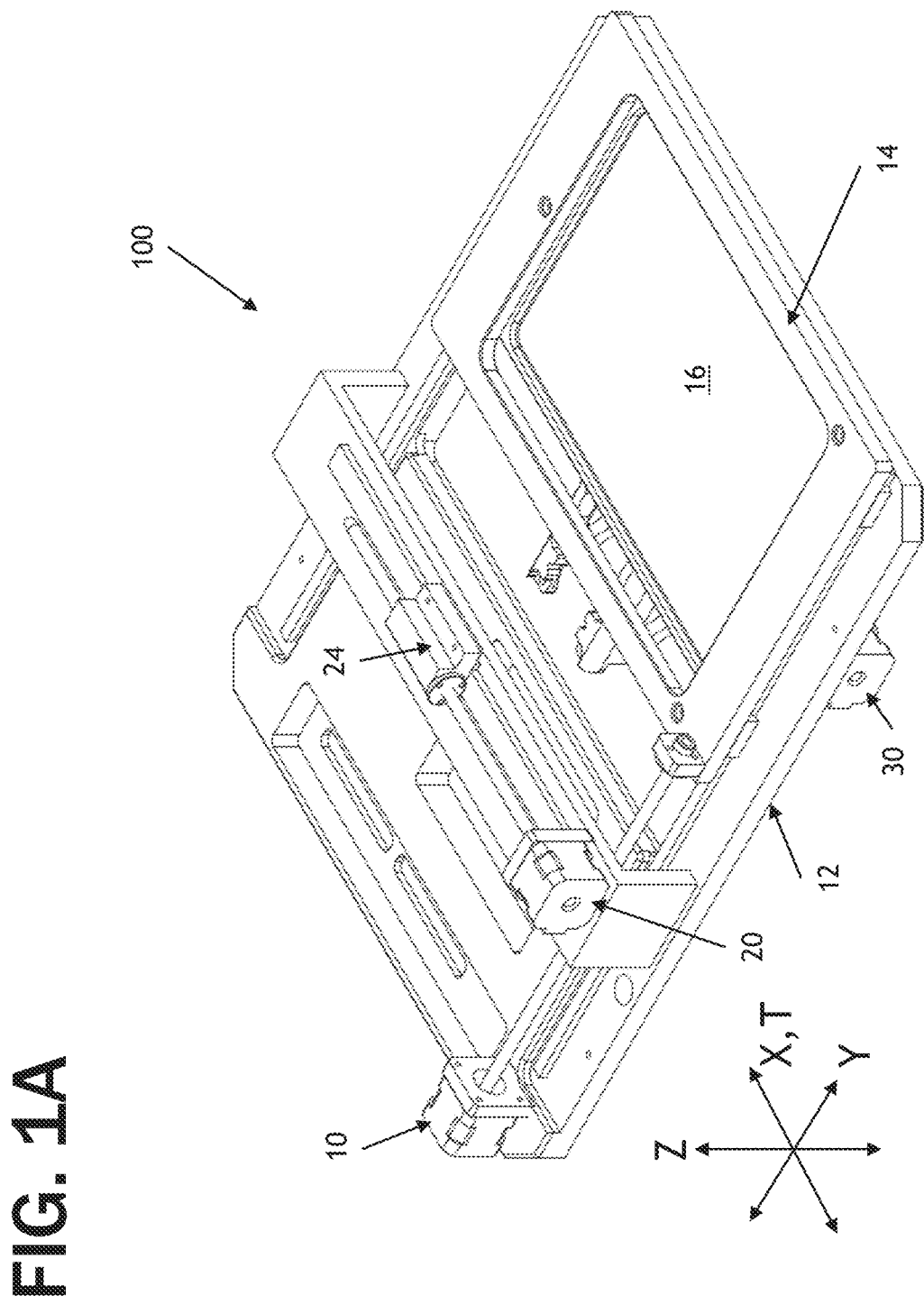
FIG. 1A shows an isometric view of a multi-modality imaging system, according to an embodiment.

FIG. 1A shows an isometric view of a multi-modality imaging system 100, according to an embodiment. System 100 includes a base plate 12, a sample stage 14 and a first translation mechanism 10 coupled with the base plate 12 and the sample stage 14. Base plate 12 functions as a central supportive element or structure. Sample stage 14 functions as a supportive element or structure for receiving and holding sample platform 16 (position of platform 16 shown in FIG. 1A, FIG. 1B, and FIG. 2A; physical representation shown in FIG. 3.) The first translation mechanism 10 is configured to translate the sample stage 14 along a first axis relative to the base plate 12. For example, with the arbitrary X-Y-Z axis shown in FIG. 1A, the first translation mechanism 10 is configured to translate the sample stage 14 along the Y-axis relative to the base plate 12. FIGS. 2A-2E, which will be discussed in more detail below, illustrate examples of the sample stage 14 in different positions along the Y-axis relative to the base plate 12.

Sample stage 14 is configured to hold a sample platform 16, which is adapted to receive and hold a sample thereon; sample platform 16, in an embodiment, provides a surface that removably interconnects with the sample stage 14 to hold and/or position one or more samples. The sample platform 16 may be removed, e.g., for cleaning, replacing or repairing and may have interchangeable inserts used for holding and imaging different samples or sample types.

Embodiments of the present invention with optical imaging systems address to imaging targets of interest contained within or on a sample. A "sample" includes and may refer to any liquid, solid, or other type of material that may be comprised of or as, in or on a cell or cells (e.g. in whole or lysed); a slurry or an extraction of cellular components; a tissue or tissues; an organ, organs, organoid or other organ-like materials; organisms such as but not limited to invertebrate or vertebrate organisms (i.e. in whole or in part); substrates such as but not limited to western blots, membranes, woven networks of fibers, gels, plastic media, glass media or other media in the form of a plate, dish, tube, slide, etc.; or any combination thereof. It should also be appreciated that "imaging system" and "imaging device" and "imager" may be used interchangeably herein, and that each includes one or more detector elements for detecting light from the sample and one or more optical elements for directing and/or focusing light onto the one or more detector elements. One skilled in the art will understand that many types of useful sensors or detectors and arrays of detectors may be used, including but not limited to CCD and CMOS sensors. Other useful detectors or sensors might include sCMOS sensors, photodiodes, avalanche photodiodes, silicon photomultiplier devices, an array of photomultiplier tubes, a focal plane array, etc.

Accordingly, when the first translation mechanism 10 operates to move the sample stage 14 along the Y-axis relative to the base plate 12, an attached sample platform 16 (and any sample that may be on sample platform 16) concomitantly moves relative to base plate 12. Sample platform 16 may comprise an optically transparent glass or plastic material or may comprise an optically opaque plastic or metal or glass material, depending on the application and system configuration.

Figure 1B:
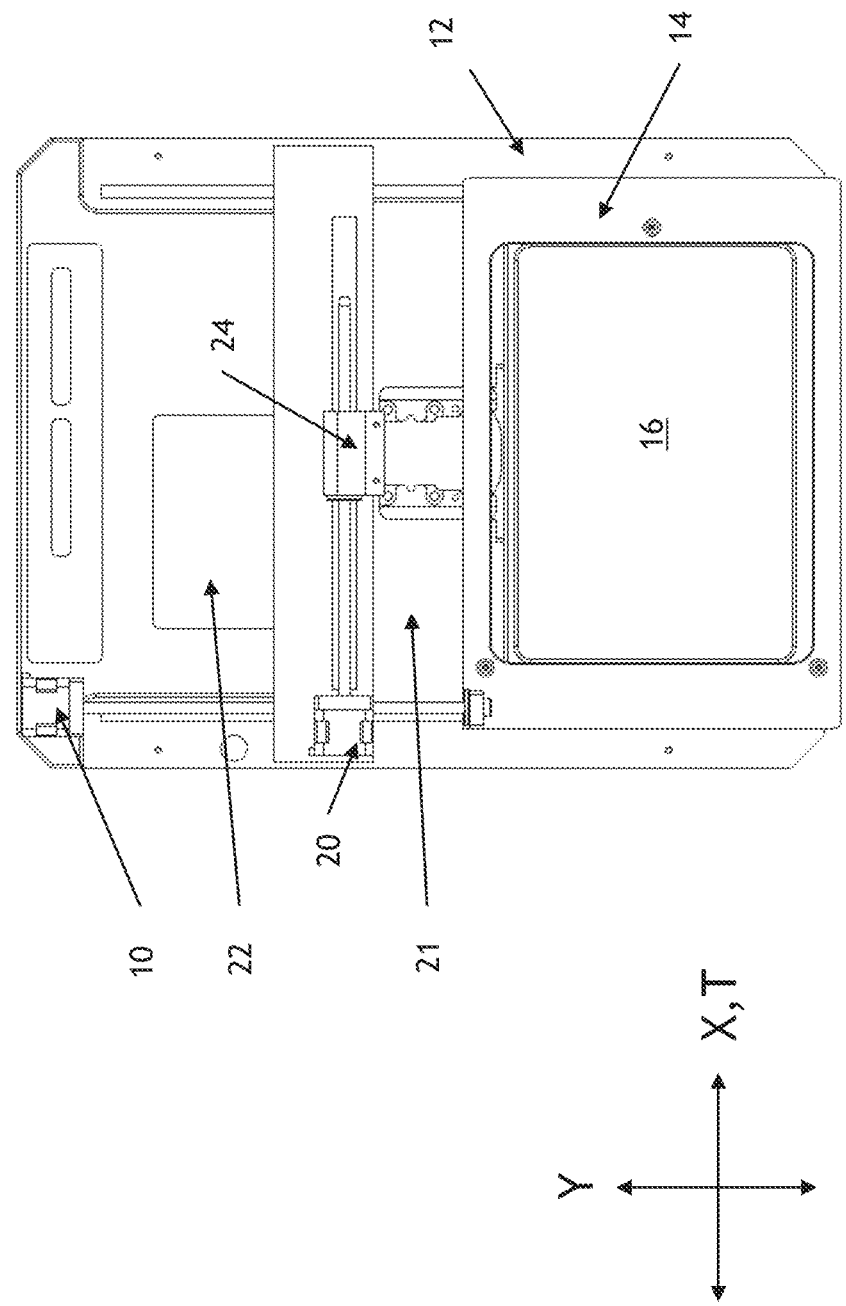
FIG. 1B shows a top view of the multi-modality imaging system of FIG. 1A, according to an embodiment.

FIG. 1B shows a top view of the multi-modality imaging system 100 of FIG. 1A, according to an embodiment. As shown, a first region 21 and a second region 22 in base plate 12 are identified. In an embodiment, each of first region 21 and second region 22 may include an exposed region of base plate 12, e.g., devoid of material, or including an optically transparent material or window. In some embodiments, one or both of first region 21 and second region 22 may be a solid region of base plate 12. As shown in FIG. 1A, sample stage 14 is located in a loading position, away from first region 21 and second region 22. When in the loading position, sample stage 14 may partially overlap with first region 21. Controlled movement of sample stage 14 between various positions will be discussed below with reference to FIGS. 2A-2E.

In an embodiment, system 100 also includes a second translation mechanism 20 coupled with the base plate 12 and an illumination device 24. Second translation mechanism 20 is configured to translate the illumination device 24 along a second axis relative to the base plate 12, with the second axis being substantially perpendicular to the first axis. For example, with the arbitrary X-Y-Z axis shown in FIG. 1A, the second translation mechanism 20 is configured to translate the illumination device 24 along the T-axis relative to the base plate 12. In an embodiment, illumination device 24 is configured to illuminate a portion of the first region 21. In operation, one or more illumination source(s) of illumination device 24 illuminate a portion of first region 21, and the portion illuminated may be scanned, e.g., by second translation mechanism 20 translating illumination device 24 along the second axis. The portion of first region 21 illuminated by illumination device 24 may form a spot, a line, a stripe or a larger area or region. Illumination device 24 may include a single illumination source or multiple illumination sources. For example, illumination device 24 may be configured with one or multiple broadband sources, and/or it may be configured with one or multiple narrowband sources, such as one or multiple LEDs operating in different frequency/wavelength bands, depending on the imaging application. For example, for optical imaging applications, one or more illumination sources emitting at one or more absorption wavelengths of one or more targets of interest may be used. Where multiple sources are included, each source may be configured to illuminate the same area (e.g., spot or line or 2-dimensional area such as a rectangle, circle, oval, etc.), or different areas, or partially overlapping areas within first region 21, or portions thereof.

Figure 1C:
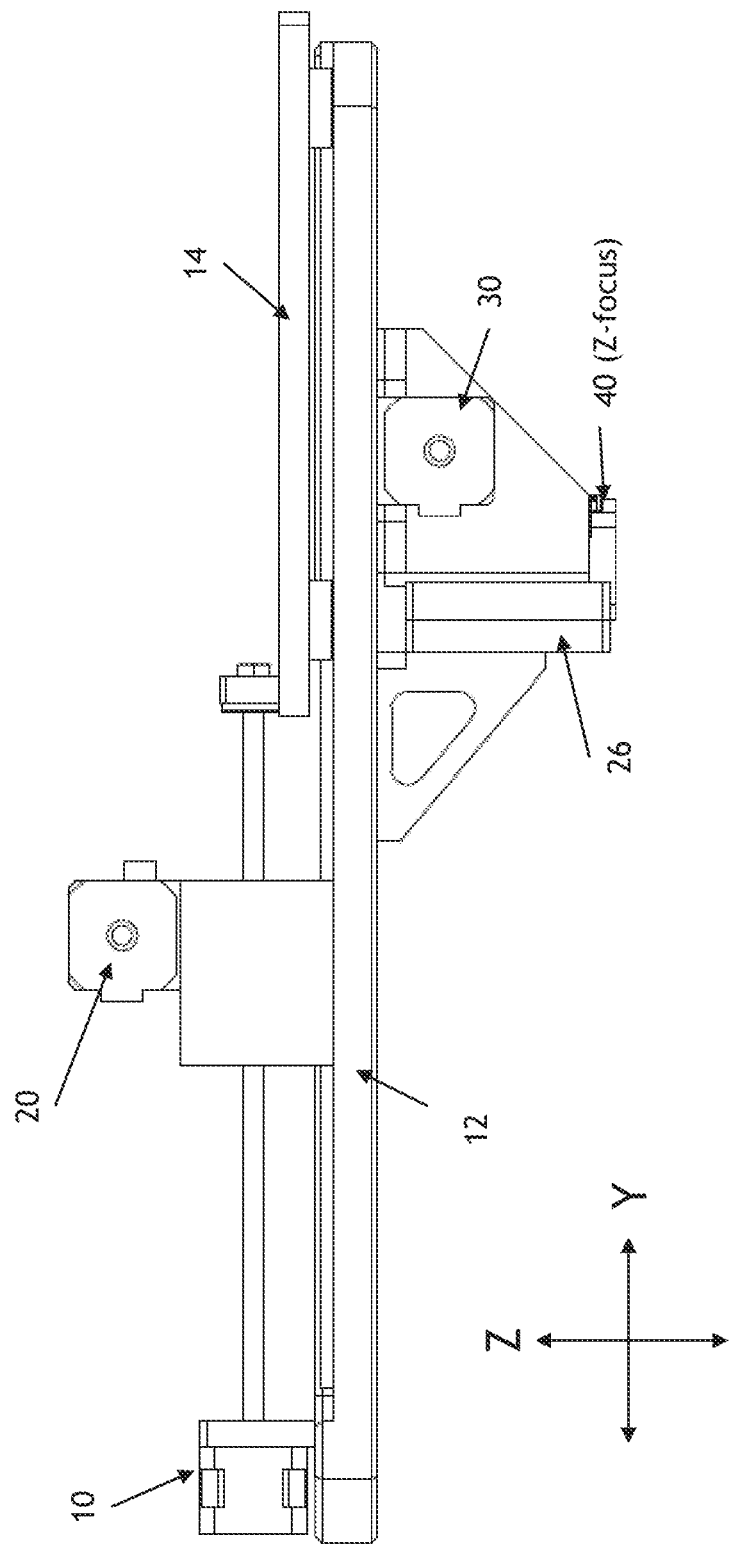
FIG. 1C shows a side view of the multi-modality imaging system of FIG. 1A, according to an embodiment.

FIG. 1C shows a side view of the multi-modality imaging system 100, according to an embodiment, and FIG. 1D illustrates shows a frontal view of the multi-modality imaging system 100, according to an embodiment. As shown, system 100 also includes a third translation mechanism 30, coupled with the base plate 12 and a first imaging device 26, (position of first imaging device 26 mount position shown in FIG. 1C and FIG. 1D; physical representation shown in FIG. 3.) and configured to translate the first imaging device 26 along a third axis, X. In an embodiment, the third axis, X, is parallel to the second axis and perpendicular to the first axis. For example, with the arbitrary X-Y-Z axis shown in FIG. 1A, the third translation mechanism 30 is configured to translate the imaging device 26 along the X-axis relative to the base plate 12. However, third axis, X, need not be parallel to the second axis and may be arranged at an angle along the X-Y plane with respect to the second axis in other embodiments. In the embodiment shown in FIG. 1C and FIG. 1D, imaging device 26 and third translation mechanism 30 are located proximal to the base plate 12 on the side opposite the sample stage 14 (and also on the side opposite illumination device 24). In other embodiments, imaging device 26 and third translation mechanism 30 may be located proximal to the base plate 12 on the same side as the sample stage 14 (and also on the same side as illumination device 24). Similarly, in the embodiment shown in FIG. 1C and FIG. 1D, illumination device 24 and second translation mechanism 20 are located proximal to the base plate 12 on the same side as the sample stage 14 (and also on a side opposite imaging device 26); in other embodiments, illumination device 24 and second translation mechanism 20 may be located proximal to the base plate 12 on the side opposite to the sample stage 14 (and also on the same side as imaging device 26 or on a side opposite imaging device 26). In certain embodiments, imaging device 26 may have one or more/multiple illumination sources. For example, the one or more/multiple illumination sources of imaging device 26 may include a laser, LED or other illumination source. For example, for optical imaging applications, imaging device 26 may include one or more illumination sources emitting at one or more absorption wavelengths of one or more targets of interest.

In an embodiment, during operation, second translation mechanism 20 and third translation mechanism 30 are configured to move together so as to translate the illumination device 24 along the second axis simultaneously or in step with translating the first imaging device 26 along the third axis, X, e.g., in response to control signals received from a control system (not shown). In other embodiments, second translation mechanism 20 and third translation mechanism 30 are configured to move separately.

In another embodiment, system 100 also includes a fourth translation mechanism 40 coupled with the third translation mechanism 30 and/or coupled with first imaging device 26. Fourth translation mechanism 40 is configured to translate the first imaging device 26 along a fourth axis. In an embodiment, the fourth axis is substantially perpendicular to both the second axis and the first axis (and the third axis). For example, with the arbitrary X-Y-Z axis shown in FIG. 1A, the fourth translation mechanism 40 is configured to translate the imaging device 26, or a component of the imaging device 26, such as a lens element, along the Z-axis relative to the base plate 12. In operation, translating the imaging device 26, or the component of the imaging device 26, along the Z-axis enables a Z-focus or change of focal plane for imaging device 26.

In an embodiment, sample stage 14 may be moved between at least a first position and a second position: for the first position, at least a first portion of sample stage 14 is positioned proximal to the first region 21 of the base plate 12, and for the second position, the first portion of the sample stage is positioned proximal to the second region 22 of the base plate. Each of the first position and the second position may correspond to imaging positions, where a sample on the sample platform 16 on the sample stage 14 may be imaged. Additionally, each of, or both of, the first and second positions may correspond to a loading position wherein a user may access the sample stage 14 to load a sample platform 16 (with or without a sample), or to load a sample on a sample platform 16 already on sample stage 14. A third position, such as a loading position may be provided in certain embodiments.

Figure 2A:
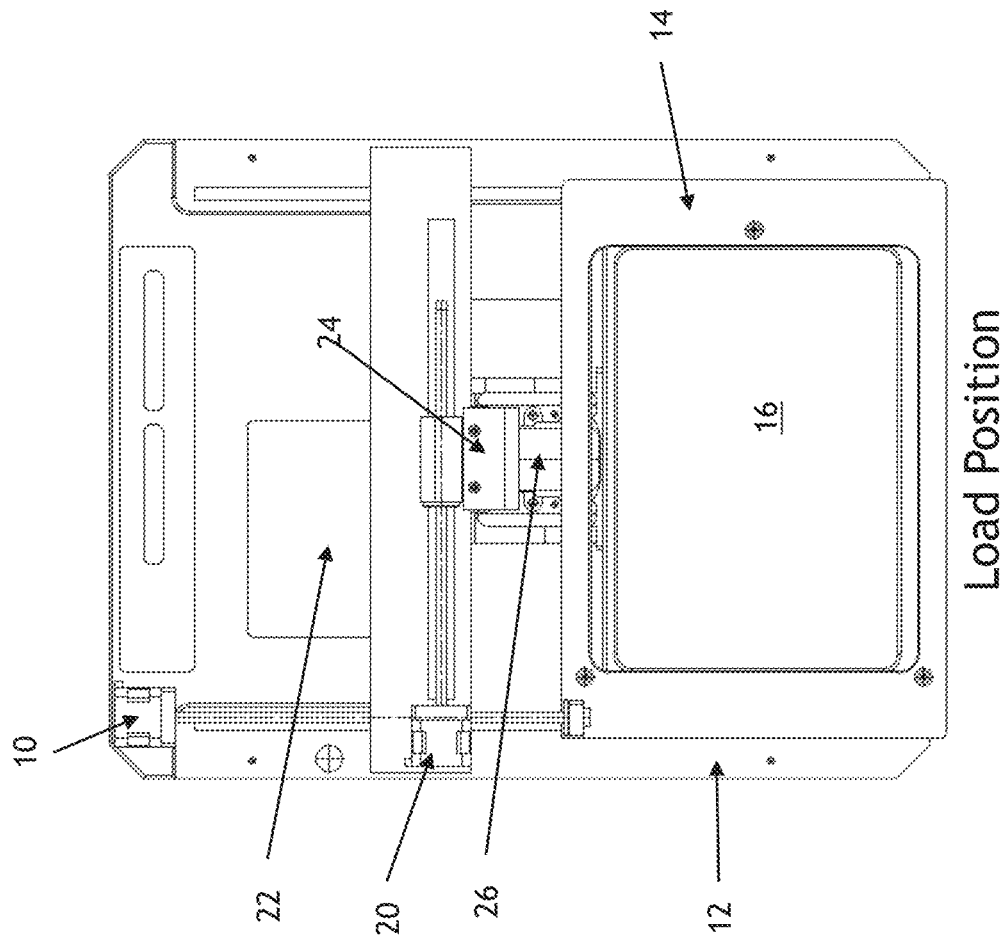
FIG. 2A shows a top view of a multi-modality imaging system, with a sample stage positioned in a loading position, according to an embodiment.

FIG. 2A shows a top view of the multi-modality imaging system 100, with the sample stage 14 positioned or located in a loading position, away from first region 21 and second region 22, according to an embodiment. Sample stage 14 is configured to receive and securely hold sample platform 16, which is adapted to receive and hold a sample thereon. When in the loading position, at least a portion of the sample stage 14 is positioned proximal a loading region which provides access to load the sample platform 16 on the sample stage 14. For example, when in the loading position the volume above the sample stage 14 may be completely clear of obstacles, e.g., clear of illumination device 24 and/or other system elements.

When sample stage 14 is in the loading position, in an embodiment, the area below the sample platform is blocked off by the base plate 12 (i.e., no imaging system is accessible directly below the glass platform, or sample area without glass). For example, the base plate 12 may be configured, in an embodiment, to protect system components such as the imaging system when samples, sample platform 16 or sample platform inserts are being positioned on the sample stage 14. Also, in an embodiment, grid lines may be provided on the base plate 12, such that when in the loading position, a user is able to clearly visualize the grid lines on the base plate 12 for accurate positioning of the sample on the sample platform 16. Alternatively, this portion of the base plate 12 could include a removable insert that could be exchanged with other inserts displaying different grids or scales for sample positioning purposes. The removable inserts may be inserted onto (e.g., on top of) the sample platform and are not integrated with the base plate 12.

Controlled movement of the sample stage 14 between various positions on base plate 12 is effected by operation of first translation mechanism 10. In an embodiment, first translation mechanism 10 may include one or more rails and an actuator configured to move sample stage 14 along the one or more rails. Additionally or alternatively, the actuator may include a stepper motor, or linear screw actuator or other device capable of translating sample stage 14 along the Y-axis. Second translation mechanism 20, third translation mechanism 30, and fourth translation mechanism 40 may each include similar actuators or different actuators.

Figure 2B:
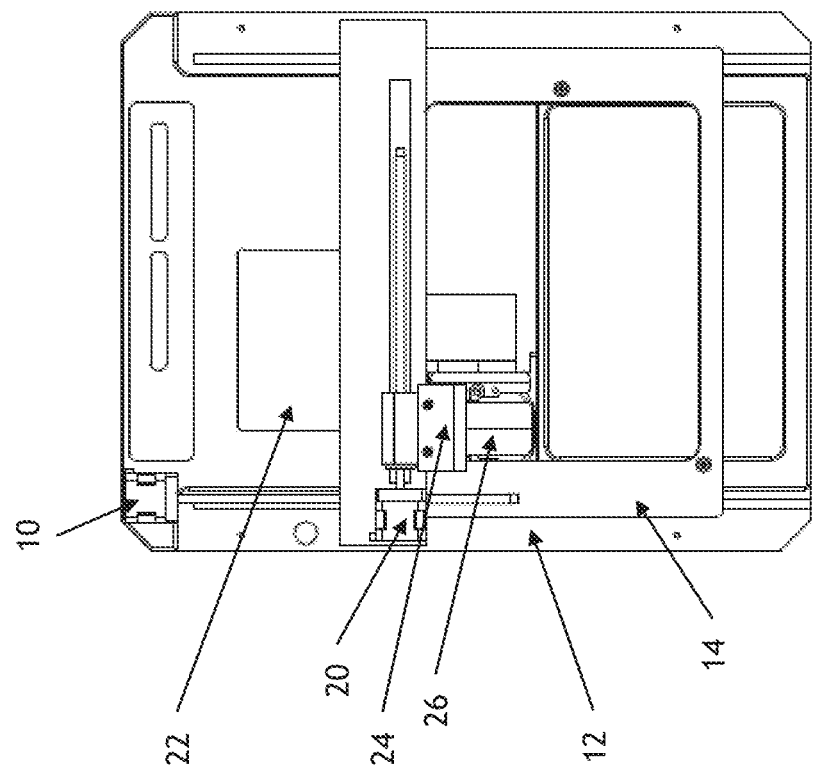
FIG. 2B shows a top view of the multi-modality imaging system of FIG. 2A, with a sample stage positioned in one of the four extreme corners of the regions associated with one of the imagers (the line-scanning imager), according to an embodiment.
Figure 2C:
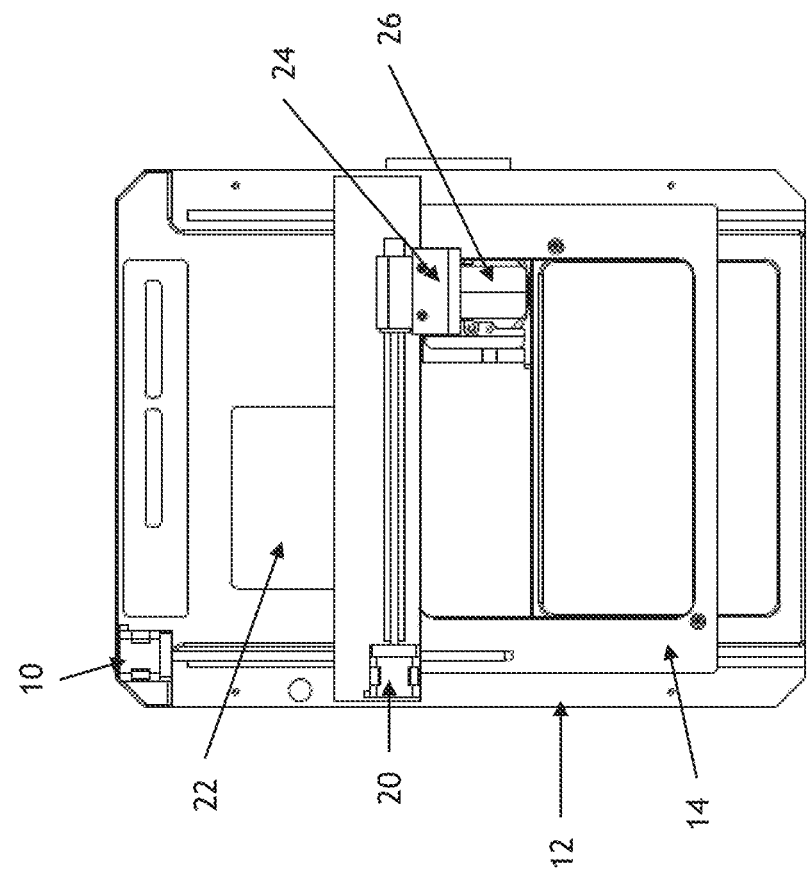
FIG. 2C shows a top view of the multi-modality imaging system of FIG. 2A, with a sample stage positioned in one of the four extreme corners of the regions associated with one of the imagers (the line-scanning imager), according to an embodiment.

FIG. 2B shows a top view of the multi-modality imaging system of FIG. 2A, with sample stage 14 positioned in a first imaging position, according to an embodiment. In the first imaging position, at least a first portion of sample stage 14 is positioned proximal to the first region 21 of the base plate 12. In FIG. 2B, imaging device 26 and illumination device 24 are shown in a first position, e.g., an initial scan position; in FIG. 2C, imaging device 26 and illumination device 24 are shown in a second position, e.g., a final scan position. For example, when in the first imaging position, a sample on the sample stage proximal to the first region 21 may be illuminated and imaged by a combination of illumination device 24 and image device 26, and where scanning is desired, a scanned image of the sample may be acquired by scanning imaging device 26 and/or illumination device 24 across the X and T axes. A larger scan or image may also be acquired by moving sample stage 14 such that a slightly different portion of the sample is exposed proximal the first region 21, e.g., scanning along the X, T axes and then repositioning sample to a slightly different position in first region 21 and then rescanning along the X, T axes to image a larger area of the sample.

In an embodiment, as shown in FIG. 3, for example, a second imaging device or system 28 is located proximal to the second region 22 of base plate 12. Second imaging system 28 may image a sample proximal to the second region 21 of the base plate 12 and may utilize illumination from illumination device 24, or it may utilize illumination from a separate source or sources. For example, in an embodiment, wherein the second region 22 is an exposed region in the base plate 12, the second imager 28 may be located proximal to the base plate 12 and configured to image a region proximal to the second exposed region in the base plate. Second imager 28 may be located proximal to the base plate 12 on the side opposite sample stage 14, or on the same side as sample stage 14. In another embodiment, second imaging system 28 may not require illumination to induce a reaction. For example, second imaging system 28 may include a chemiluminescence imaging system with detected light being generated from a chemically exothermic reaction or induced by an electrochemical stimulus.

Figure 2D:
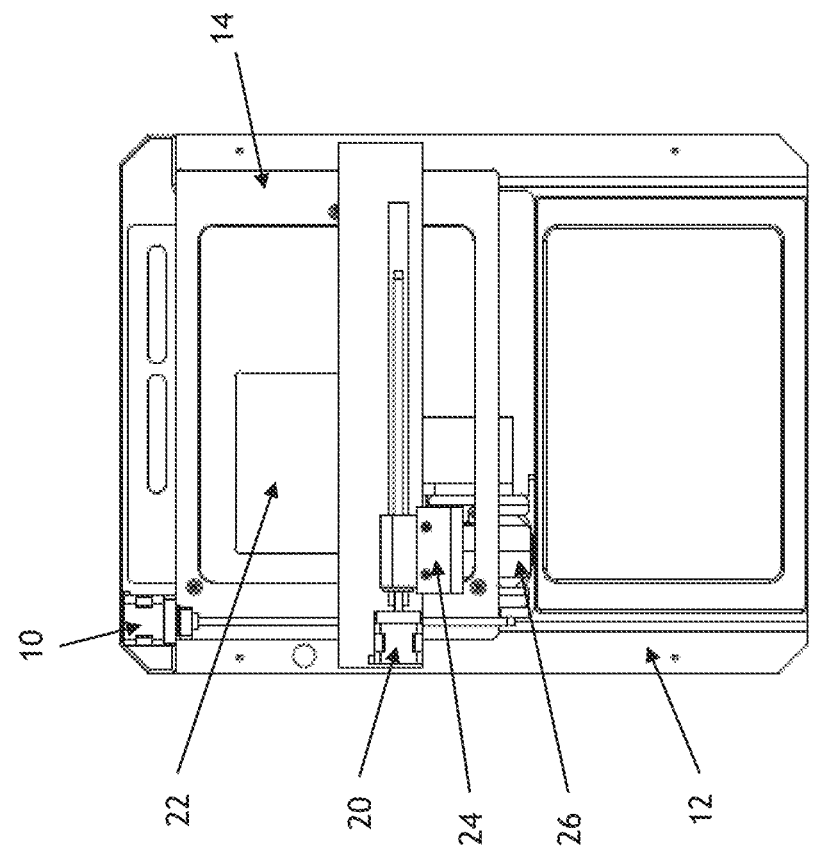
FIG. 2D shows a top view of the multi-modality imaging system of FIG. 2A, with a sample stage positioned in one of the four extreme corners of the regions associated with one of the imagers (the line-scanning imager), according to an embodiment.
Figure 2E:
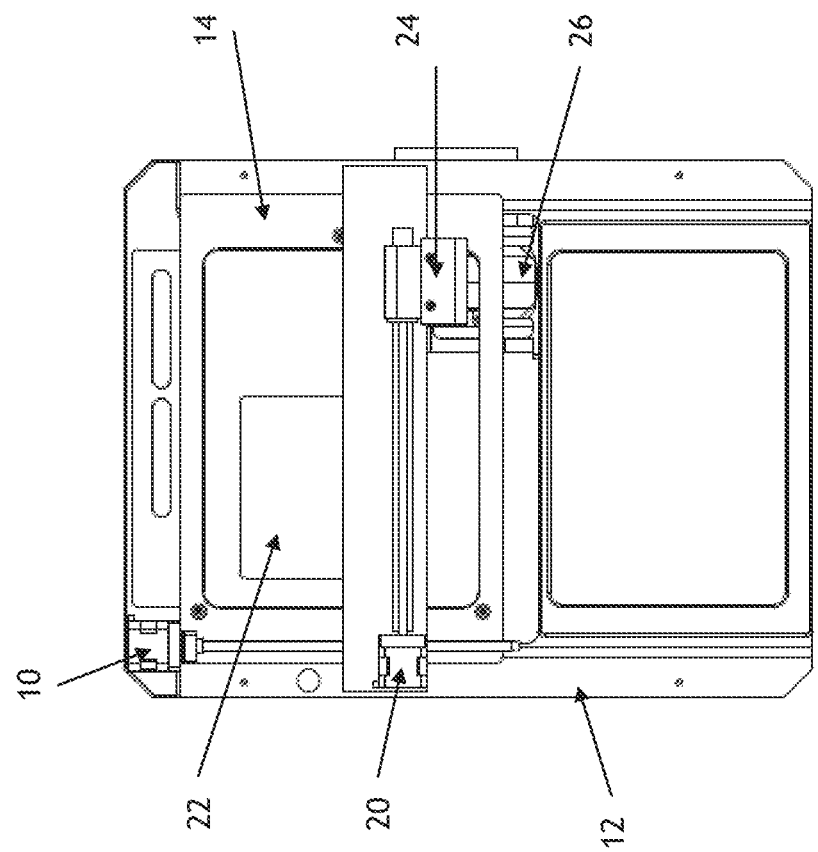
FIG. 2E shows a top view of the multi-modality imaging system of FIG. 2A, with a sample stage positioned in one of the four extreme corners of the regions associated with one of the imagers (the line-scanning imager), according to an embodiment.

FIG. 2D shows a top view of the multi-modality imaging system of FIG. 2A, with sample stage 14 positioned in a second imaging position, according to an embodiment. In the second imaging position, at least a first portion of sample stage 14 is positioned proximal to the second region 22 of the base plate 12. In FIG. 2D, illumination device 24 is shown in a first position, e.g., an initial scan position; in FIG. 2E, illumination device 24 is shown in a second position, e.g., a final scan position. For example, when in the second imaging position, a sample on the sample stage 14 proximal to the second region 22 may be illuminated by illumination device 24, and where scanning is desired, illumination device 24 may be scanned across the T-axis. FIGS. 2B-2E show the sample stage 14, illumination device 24, and imaging system 26 at extents of the area that is scannable by the imaging system 26. FIG. 2D and FIG. 2E both show that a portion of the sample stage may be placed over the second region 22 during the course of imaging with imager 26; the second imaging system 28 (see FIG. 3) can be placed such that it can image a portion of the sample platform 16 without requiring any additional range of motion in any of the actuators. This spatial efficiency is an advantage that the present embodiments provide over prior systems.

The present embodiments advantageously enable multi-modal imaging using the same system platform. For example, a line-scan imaging system may be combined with area imaging system on the same system platform; the line-scan imaging system may implement angled reflective imaging, trans-illumination imaging, epi-illumination imaging and/or fluorescence imaging and the area imaging system may implement chemiluminescence imaging as examples. For the line-scan imaging system, the resulting scanned image, e.g., following angled reflective imaging and/or fluorescence imaging, that is displayed to the user may be comprised of one, or more, parallel offset scanned stripes that may be stitched/directionally assembled together. The stripes may be generated when the sample is moved, relative to the imaging system, along the Y-axis. Subsequent stripes are created, parallel to the first stripe, after repositioning (e.g., indexing to the subsequent stripe; which may be the adjacent stripe to the previously scanned stripe or it may be the same stripe (in whole or in part) being re-scanned) the imaging system, relative to the sample, along the X-axis. Focus may be adjusted by moving a component, such as a lens, of the imaging system in a direction normal to the sample plane, relative to the sample, e.g., along the Z-axis. For sample scans that require trans-illumination, the illumination device (e.g., trans-illumination device) is moved along the T-axis parallel to the X-axis, located opposite the imaging system relative to the sample plane (as shown in FIG. 3 and FIG. 4 to be positioned above the sample plane). FIG. 3 shows a side-view of the multi-modality imaging system including imaging system 26 and imaging system 28, and includes a cutaway showing a sample laying on the sample platform 16 between the first imaging system 26 and the illumination device 24 (i.e. trans-illumination configuration), according to an embodiment. FIG. 4 shows the same view as FIG. 3, but without the cutaway.

In an embodiment, the second imager 28 may include a wide-field or area-imaging device, such as a chemiluminescence imaging system and the first imager 26 is a line-scanning imaging system. For example, the second area-imaging system 28 could capture images of samples that have more time-sensitive characteristics than some other samples which can be scanned. Since the sample would be placed on the same sample stage for both imaging systems, both imaging system 26 and imaging system 28 could be used sequentially to capture various types of signals (e.g., chemiluminescence, which is relatively time-sensitive, and fluorescence or RGB reflected light) on the same sample. These multiple acquired images could then be overlaid onto each other, providing more information from a single sample than any one of the signal types could on its own.

Moving the imaging system 26 only on a slower step-axis (X-axis) and focus-axis (fourth axis), the motion requirements of any moving mass and cable cycling stress is advantageously simplified. Also, having the imaging system remaining stationary, during scanning, alleviates possible functionality and stress related issues that could impact the scan quality. For example, in an embodiment, the imaging system 26 only moves in one axis (X-axis), and remains stationary while the actual scanning motion is done by actuator 10 moving the sample stage 14. The imager 26 can then be moved between scan passes to position it to collect the next parallel offset scan stripe that is assembled to produce the complete image.

Moving the illumination device 24 on a separate axis from imaging system 26 allows the illumination components to be minimally sized similar to the imaging system, simplifying uniformity calibration, and adds the potential flexibility for additional illumination sources or components that can be shifted opposite of the imaging system.

The embodiments herein are useful for point-scan imaging, line-scan imaging, and area imaging applications. For line-scan imaging, a line is scanned (swept) along an axis to generate an image stripe, the imaging system is indexed relative to the sample and scanned again, and so on, until finished at which point all stripes are stitched (e.g., directionally assembled) or combined together to form a complete image.

FIG. 5 illustrates a method 500 of imaging a sample using one or multiple imaging modalities according to an embodiment. In step 510, a sample is received. Receiving the sample may include receiving sample platform 16 on sample stage 14. The sample may already be located on sample platform 16 when the user positions sample platform 16 on sample stage 14. Alternatively, sample platform 16 may be positioned on sample stage 14 and then the sample may be placed, and secured, onto sample platform 16. In an embodiment, sample stage 14 and sample platform 16 may be configured such that when sample platform 16 is positioned on sample stage 14, the sample is located in a first portion of sample stage 16 and such that when sample stage 16 is moved to a first imaging position, e.g., proximal to the first exposed region 21 in base plate 12, the first portion of the sample stage is positioned proximal to the first exposed region 21 in the base plate 12. Guidelines or markers on the baseplate may facilitate placement by the user. Proper placement of the sample on the sample platform helps ensure proper registration of the sample relative to imagers 26, 28 when in an imaging position. In an embodiment, sample stage 14 may be repositioned, if needed, to the loading position so that sample platform 16 may be received without interference from other system components. For example, first translation mechanism 10 may be activated to translate or move sample stage 14 to the loading position as shown in FIG. 1B.

In step 520, sample stage 14 is moved to an imaging position. For example, first translation mechanism 10 may be activated to translate or move sample stage 14 to a first imaging position proximal to first exposed region 21 of base plate 12 or proximal to second region 22 of base plate 12. In step 530, the sample is imaged using a first imaging system. For example, with sample stage 14 positioned such that the sample is proximal to region 21 of base plate 12, the sample may be imaged using first imaging device 26. Depending on the imaging modality of first imaging device 26, illumination device 24 may be simultaneously activated.

In one embodiment, for example, imaging device 26 includes a line scanning imaging system including a detector and one or more illumination sources. As an example, one useful imaging system is provided in US Patent Application Publication No. 2020/0220332 A1, titled "LASER LINE ILLUMINATION USING COMBINED SINGLE-MODE AND MULTI-MODE LASER SOURCES", which is hereby incorporated by reference in its entirety. In this embodiment, third translation mechanism 30 may be activated to scan imaging device 26 along the third axis so as to scan the line generated by the one or more illumination sources and detect light reflected and/or emitted from the sample. In another embodiment, imaging device 26 includes a line-scanning imaging system including a detector without illumination sources. In this embodiment, second translation mechanism 20 may be activated to scan illumination device 24 along the second axis so as to scan the line generated by the one or more illumination sources of illumination device 24, and third translation mechanism 30 may be simultaneously activated to scan imaging device 26 along the third axis to detect light emitted from the sample (e.g., a trans-illumination-based imaging system). Where desirable, fourth translation mechanism 40 may be activated to refocus imaging device 30 along the Z-axis when acquiring one or more images of the sample. In step 530, one or more images of the sample may be acquired.

In step 540, sample stage 14 is moved to another imaging position. For example, first translation mechanism 10 may be activated to translate or move sample stage 14 to a second imaging position from the first imaging position, e.g., proximal to second region 22 of base plate 12 or proximal to first exposed region 21 of base plate 12.

In step 550, the sample is imaged using a second imaging system. For example, with sample stage 14 positioned such that the sample is proximal to second region 22 of base plate 12, the sample may be imaged using the second imaging device 28. Depending on the imaging modality of second imaging device 28, illumination device 24 may be simultaneously activated (e.g., in some embodiments, illumination device 24 may be configured to illuminate second region 22 in addition to first exposed region 21 or instead of illuminating first exposed region 21). In one embodiment, for example, second imaging device 28 includes an area imaging system. For example, second imaging system 28 may include a detector configured to detect a chemiluminescence signal emitted from the sample. Alternatively, second imaging system 28 may include a different area imaging system configuration.

In step 560, image(s) acquired in step 530 and/or in step 550 are processed. For example, where multiple line-scan images are acquired, the line-scan images may be stitched, assembled, combined or compiled together to form a composite image of a region of the sample or the entire sample. Where area/wide-field images are acquired, these may be processed as desired. In step 570, one or more images may be visually presented, e.g., on a display monitor or other display device. Where multiple imaging modalities are used to acquire images of the sample, e.g., line-scan imaging in step 530 and area imaging in step 550, the resulting images may be provided separately for visualization or they may be combined to form a composite image that is viewable on a display device.

It should be appreciated that steps 540 and 550 are optional; in an embodiment, sample stage 14 may be moved to a single imaging location in step 520, and imaging performed in step 530 and processing of the image(s) acquired in step 560 may be performed without imaging in a second imaging location.

In certain embodiments, the T-axis carries illumination source 24. Since the T-axis can move independently of the X-axis, various other devices or components may be coupled with the second translation mechanism 20 and moved on the T-axis simultaneously with illumination source 24, to any desired position. For example, in an embodiment where at least one of the X- or T-axis is on the same side of the sample platform as the sample, regardless of the position of the other of the two axes, the T-axis (second translation mechanism 20) may be configured to carry a system to position (e.g., move, manipulate, or dispense) a sample or other material or substance which interacts physically with the sample on the sample platform, (e.g., a system for dispensing an activator or chemical agent onto the sample, an arm to grip and move microtiter plates, an automated pipette, or a dispensing head, etc.). In an embodiment where the X-axis (third translation mechanism 30) carries an imaging system, and the T-axis is on the opposite side of the sample platform as the X-axis, the T-axis could carry one or multiple different optical backgrounds for imaging. In certain embodiments, the X- and T-axes could both carry imaging systems, adding additional imaging modes available for use (e.g., one images in the UV spectrum, and the other in the visible and/or infrared and/or near-infrared, thus circumventing the challenge in selecting optical components compatible with a larger wavelength range).

The embodiments described herein are particularly useful for implementing one or multiple imaging modalities using the same system platform. For example, the various imaging modalities may include point scanning and line-scanning imaging systems and area imaging or wide-field imaging systems, including but not limited to fluorescence imaging systems, optical imaging systems, Confocal Laser Scanning Microscopy (CLSM) systems, and/or a combination of imaging systems. Additionally, illumination device 24 and imaging device 26 may operate in a trans-illumination mode where optical elements are configured to direct illumination (e.g., illumination beam or light beam) from the illumination source 24 toward the sample platform 16 from a side opposite the imaging system 26. For example, the illumination source of illumination device 24 may include a laser, LED or other illumination source.

To image in fluorescence, a one or more targets of interest (e.g., within or on a sample where such targets of interest may contain a fluorescent material, which may be located on sample platform 16) is illuminated by an optical signal having a first spectral content (excitation light) where a portion of such a signal is absorbed by at least part of the target of interest and emitted as optical signal of a second spectral content (emission light). The emission light is then detected as a measure of the amount of the fluorescent material present in or on the one or more targets of interest within or on a sample at the designated, illuminated location. Imaging an area of a sample containing one or more targets of interest comprising fluorescent material, therefore, requires excitation light delivered to the one or more targets of interest within or on a sample, an imaging system that collects light from the one or more targets of interest and projects the collected light onto an optical detector (e.g., detector array), and a means to separate the emitted fluorescence light from the portion of excitation light that makes its way through the imaging system. The latter, typically, includes one or more optical interference filters. In certain aspects, relevant filter wavelengths may be anywhere within the ultra-violet to visible to far-red spectrum.

Wide-Field imaging, as considered herein, includes collecting light from a contiguous area and projecting it onto a detector array, such as a CCD or other detectors having an array of sensing locations or pixels, at the same time in a way that preserves the relative locations of each point within the contiguous area. Wide-field imaging is different from collecting light from one point (or line) at a time and sequentially scanning to a different point (or line) in order to cover a larger area, i.e. point-scan (or line-scan) imaging. Another imaging modality includes collecting light from a large area and condensing the total amount of light onto a detector and reading it as total signal; such measurement techniques do not require specific location information.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

A "target of interest" may include a material or molecule of interest such as a biomolecule. Biomolecules are molecules of a type typically found in a biological system, whether such molecule is naturally occurring or the result of some external disturbance of the system (e.g., a disease, poisoning, genetic manipulation, etc.), as well as synthetic analogs and derivatives thereof (e.g. recombinant). Non-limiting examples of biomolecules include amino acids (naturally occurring or synthetic), peptides, polypeptides, glycosylated and unglycosylated proteins (e.g., polyclonal and monoclonal antibodies, receptors, interferons, enzymes, etc.), nucleosides, nucleotides, oligonucleotides (e.g., DNA, RNA, PNA oligos), polynucleotides (e.g., DNA, cDNA, RNA, etc.), carbohydrates, hormones, haptens, steroids, toxins, liposomes, micelles and vesicles, etc. and any combination thereof. Biomolecules may be isolated from natural sources, or they may be synthetic. The target of interest may be, for example, an enzyme or other protein. The target of interest may be a peptide or a polypeptide. The target of interest may be an antibody, antibody-like or a fragment of an antibody. The target of interest may be a nucleic acid molecule. The target of interest may include deoxyribonucleic acids (DNA) or ribonucleic acids (RNA). The target of interest may be a polynucleotide or other polymer. The target of interest may thus be, for example, proteins, nucleic acids, carbohydrates, lipids, or any other type of molecule or any combination thereof.

The target of interest may be unmodified or the target of interest may be modified to contain one or more labels. An unmodified target of interest may be visualized through its inherent auto-fluorescent spectral properties during optical imaging. An unmodified target of interest comprising of non-fluorescent or non-excitable material may be visualized through the administration of one or more chemical agents, such as reagents, dyes, stains and like agents to the sample comprising such unmodified target of interest prior to or during optical imaging. The target of interest may be modified to contain one or more labels through physical conjugation, chemical conjugation, genetic expression, etc. The one or more labels of the modified target of interest may comprise an excitable material. Non-limiting examples of labels include fluorescent materials (e.g. fluorophores or other like materials), phosphorescent materials (e.g. porphyrin or other like materials), bioluminescent materials (e.g. Luciferase expression or other like materials), chromophoric materials (e.g. chromophores or other like materials), etc. Embodiments of label materials of a target of interest may refer to any liquid, solid, or other type of material that absorbs light and re-emits at least a portion of what is absorbed as an optical signal (light) of a different spectral content as a measure of the amount present of that target of interest at that location.

Embodiments of the present invention with optical imaging systems address to imaging targets of interest contained in or on a sample. A "sample" includes and may refer to any liquid, solid, or other type of material that may be comprised of or as, in or on a cell or cells (e.g. in whole or lysed); a slurry or an extraction of cellular components; a tissue or tissues; an organ, organs, organoid or other organ-like materials; organisms such as but not limited to invertebrate or vertebrate organisms (i.e. in whole or in part); substrates such as but not limited to western blots, membranes, woven networks of fibers, gels, plastic media, glass media or other media in the form of a plate, dish, tube, slide, etc.; or any combination thereof.

Exemplary embodiments are described herein. Variations of those exemplary embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. An imaging system, comprising:
   a base plate having a first exposed region and a second region, wherein the first exposed region of the base plate is devoid of material or includes an optically transparent material, and is distinct and separate from the second region of the base plate;
   a sample stage, configured to hold a sample platform;
   a first translation mechanism, coupled with the base plate and the sample stage and configured to translate the sample stage on the base plate along a first axis between a first position and a second position, wherein when in the first position a first portion of the sample stage is positioned proximal to the first exposed region in the base plate, and when in the second position, the first portion of the sample stage is positioned proximal to the second region of the base plate;
   an illumination device located proximal to the base plate, and configured to illuminate a portion of the first exposed region in the base plate;
   a second translation mechanism, coupled with the base plate and the illumination device and configured to translate the illumination device along a second axis, the second axis being substantially perpendicular to the first axis;
   a first imager located proximal to the base plate on a side opposite the sample stage relative to the illumination device and configured to image the portion of the first exposed region in the base plate when the sample stage is in the first position, wherein the first imager acquires an image using a first imaging modality;
   a third translation mechanism, coupled with the base plate and the first imager and configured to translate the first imager along a third axis, the third axis being parallel to the second axis; and
   a second imager located proximal to the base plate and in fixed relation to the base plate, wherein the second imager is configured to image a region proximal to the second region in the base plate when the sample stage is in the second position, and wherein the second imager acquires an image using a second imaging modality different from the first imaging modality.

2. The imaging system of claim 1, further comprising a fourth translation mechanism coupled with the third translation mechanism and configured to translate the first imager along a fourth axis, the fourth axis being substantially perpendicular to both the third axis and the first axis.

3. The imaging system of claim 1, wherein the second region is a second exposed region in the base plate and is devoid of material or includes an optically transparent material.

4. The imaging system of claim 1, wherein the second imager is located proximal to the base plate on the side opposite the sample stage relative to the illumination device.

5. The imaging system of claim 1, wherein the second imager is located proximal the base plate on the same side as the sample stage relative to the illumination device.

6. The imaging system of claim 1, wherein the second imager includes a detector selected from the group consisting of a CCD detector, a PMT detector, an APD detector, and a sCMOS detector.

7. The imaging system of claim 1, wherein the second translation mechanism and the third translation mechanism are configured to move together so as to translate the illumination device along the second axis simultaneously or in step with moving the first imager along the third axis.

8. The imaging system of claim 1, wherein the second region of the base plate is a loading region that provides access to load the sample platform on the sample stage.

9. The imaging system of claim 1, wherein the second region is a second exposed region in the base plate and is devoid of material or includes an optically transparent material, wherein the first translation mechanism is further configured to translate the sample stage on the base plate along the first axis to a third position proximal to a loading region of the base plate, wherein when in the third position the first portion of the sample stage is positioned proximal the loading region and provides access to load the sample platform on the sample stage.

10. The imaging system of claim 1, further including a control system comprising one or more processors, the control system configured to control operation of at least the first translation mechanism, the second translation mechanism and the third translation mechanism.

11. The imaging system of claim 10, wherein the control system is further configured to control operation of the first imager and the illumination device.

12. The imaging system of claim 10, wherein the control system is further configured to control operation of a fourth translation mechanism coupled with the third translation mechanism, the fourth translation mechanism configured to translate the first imager along a fourth axis, the fourth axis being substantially perpendicular to both the third axis and the first axis.

13. The imaging system of claim 1, wherein the first imager includes an imaging device and one or multiple light sources positioned such that either 1) light from the one or multiple light sources incident on the sample stage proximal to the first exposed region reflects toward the imaging device, or 2) light incident on the sample stage is coaxial with an imaging axis of the imaging device.

14. The imaging system of claim 1, wherein the first imaging modality and the second imaging modality are each selected from the group of imaging modalities comprising line-scan imaging, point-scan imaging, area imaging, widefield imaging, fluorescence imaging, chemiluminescence imaging, optical imaging, and confocal laser scanning microscopy.

15. The imaging system of claim 1, wherein the illumination device includes one or multiple illumination sources.

16. The imaging system of claim 15, wherein the one or multiple illumination sources are located proximal to the base plate on an opposite side and/or same side of the base plate as the sample stage, and configured to illuminate a portion of the first exposed region in the base plate.

17. The imaging system of claim 15, wherein each of the one or multiple illumination sources emit light at different wavelengths.

18. The imaging system of claim 1, wherein the first imager comprises a fluorescence imaging system and the second imager includes a chemiluminescence imaging system.

19. The imaging system of claim 18, wherein the fluorescence imaging system includes a bi-telecentric imaging system.

* * * * *